(12) United States Patent
Murofushi et al.

(10) Patent No.: US 12,733,374 B2
(45) Date of Patent: Sep. 8, 2026

(54) DISPLAY DEVICE AND METHOD FOR MANUFACTURING SAME

(71) Applicant: Sharp Display Technology Corporation, Kameyama City (JP)

(72) Inventors: Norio Murofushi, Kameyama City (JP); Eiji Fujimoto, Kameyama City (JP); Atsushi Shohji, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 379 days.

(21) Appl. No.: 18/687,957

(22) PCT Filed: Nov. 5, 2021

(86) PCT No.: PCT/JP2021/040777
§ 371 (c)(1),
(2) Date: Feb. 29, 2024

(87) PCT Pub. No.: WO2023/079680
PCT Pub. Date: May 11, 2023

(65) Prior Publication Data
US 2024/0431141 A1 Dec. 26, 2024

(51) Int. Cl.
*H10K 59/80* (2023.01)
*H10K 59/12* (2023.01)
(Continued)

(52) U.S. Cl.
CPC ..... *H10K 59/8723* (2023.02); *H10K 59/1201* (2023.02); *H10K 59/1213* (2023.02); *H10K 59/122* (2023.02); *H10K 59/873* (2023.02)

(58) Field of Classification Search
CPC ........... H10K 59/1201; H10K 59/1213; H10K 59/122; H10K 59/8723; H10K 59/873; H10K 50/00; H10K 59/00
See application file for complete search history.

(56) References Cited

U.S. PATENT DOCUMENTS 7,755,737 B2 * 7/2010 Taniguchi ......... G02F 1/136227 349/155
2005/0001546 A1 * 1/2005 Yamaguchi .......... H10K 71/166 313/506

(Continued)

FOREIGN PATENT DOCUMENTS

CN 112310316 A * 2/2021 ........... H10K 59/122
KR 20200036158 A * 4/2020 ........... G06F 1/1616

(Continued)

*Primary Examiner* — Scott B Geyer
(74) *Attorney, Agent, or Firm* — ScienBiziP, P.C.

(57) ABSTRACT

An organic EL display device includes a resin substrate provided as a base substrate, a TFT layer provided on the resin substrate and in which TFTs are arranged for each subpixel, and a plurality of photo spacers provided on the TFT layer, in which a recessed portion having a caldera shape that is open upward is formed at a top portion of each photo spacer, each photo spacer and the recessed portion are formed in a circular shape in a plan view, and a ratio of a diameter of an opening end portion of the recessed portion to a diameter of a base portion of the photo spacer is greater than 0 and lower than 0.8.

20 Claims, 9 Drawing Sheets

(51) Int. Cl.

*H10K 59/121* (2023.01)
*H10K 59/122* (2023.01)

(56) References Cited

U.S. PATENT DOCUMENTS

| | | | | |
|---|---|---|---|---|
| 2021/0202904 | A1* | 7/2021 | Shin | H10K 59/873 |
| 2021/0257579 | A1 | 8/2021 | Okabe et al. | |
| 2022/0077434 | A1* | 3/2022 | Seo | H10K 59/173 |

FOREIGN PATENT DOCUMENTS

| | | | | |
|---|---|---|---|---|
| WO | 2020/039555 | A1 | 2/2020 | |
| WO | WO-2020227930 | A1 * | 11/2020 | H10K 59/8723 |

* cited by examiner

DISPLAY DEVICE AND METHOD FOR MANUFACTURING SAME

TECHNICAL FIELD

The disclosure relates to a display device and a method for manufacturing the same.

BACKGROUND ART

In recent years, self-luminous organic electroluminescence (hereinafter also referred to as "EL") display devices using organic EL elements attract attention as display devices that can replace liquid crystal display devices. Here, in the organic EL elements, for example, a first electrode, an organic EL layer, and a second electrode are layered in order on a thin film transistor (hereinafter also referred to as "TFT") layer in which a plurality of TFTs are arrayed for each subpixel that is the smallest unit of an image. For example, WO 2020/039555 proposes a display device including an edge cover that covers a peripheral end portion of a first electrode, in which a portion projecting from an upper face of the edge cover constitutes a photo spacer.

SUMMARY

Technical Problem

Here, a common function layer and the second electrode constituting the organic EL layer are formed in a vapor deposition method using a vapor deposition mask common to a plurality of subpixels constituting the display region. Specifically, a common metal mask (CMM; a mask in which openings are provided for display devices in a one-to-one manner) available for patterning in panel units as a vapor deposition mask is placed on photo spacers formed on a vapor deposited substrate, and a vapor deposition material is vapor-deposited thereon through the openings of the CMM. On the other hand, when individual function layers corresponding to a plurality of subpixels are formed, a fine metal mask (FMM; a mask on which openings are provided for each color (e.g., including a function layer common to red and green)) available for patterning in units of subpixels is used as a vapor deposition mask, and a vapor deposition material is vapor-deposited through the openings of the FMM in the same manner as described above.

As described above, since the vapor deposition mask is brought into contact with the top portions of the photo spacers during vapor deposition, a vapor deposition material (common material) is deposited on the top portions of the photo spacers during vapor deposition using the CMM, and then the top portions of the photo spacers are brought into contact with the FMM during vapor deposition using the FMM, and as a result a phenomenon in which the common material is transferred to the FMM as vapor deposition foreign matter (hereinafter also referred to as a "stamp phenomenon") may be caused. Due to this stamp phenomenon, a problem that the vapor deposition foreign matter adhering to the FMM further adheres to another layer may arise in the next vapor deposition step. This problem becomes more conspicuous as the vapor deposition cycle progresses further. In this case, in an automated optical inspection (hereinafter, also referred to as an "AOI") performed after the vapor deposition step, the number of defects (the number of spots where vapor deposition foreign matter adheres) of the vapor deposited substrate overflows, thereby causing generation of non-inspected area portion, and as a result, the manufacturing yield of the display device decreases.

However, in the display device described in WO 2020/039555, since the top portions of the photo spacers constituted by a protruding portion on the upper face of the edge cover has a convex shape in a cross-sectional view (side view), it is fundamentally difficult to curb the stamp phenomenon.

The disclosure has been made in view of such circumstances, and aims to curb transfer of a vapor deposition material to a vapor deposition mask due to contact with photo spacers, whereby achieving enhancement in the production yield of display devices.

To achieve the above-described object, a display device according to the disclosure includes a base substrate, a thin film transistor layer provided on the base substrate and in which a thin film transistor is arranged for each subpixel, and a plurality of photo spacers provided on the thin film transistor layer, in which a recessed portion having a caldera shape that is open upward is formed at a top portion of each of the plurality of photo spacers, each of the plurality of photo spacers and the recessed portion are formed in a circular shape in a plan view, and a ratio of a diameter of an opening end portion of the recessed portion to a diameter of a base portion of each of the plurality of photo spacers is greater than 0 and lower than 0.8.

In addition, a display device according to the disclosure includes a base substrate, a thin film transistor layer provided on the base substrate and in which a thin film transistor is arranged for each of a plurality of subpixels, and a plurality of photo spacers provided on the thin film transistor layer, in which a recessed portion having a caldera shape that is open upward is formed at a top portion of each of the plurality of photo spacers, each of the plurality of photo spacers and the recessed portion are formed in a rectangular shape in a plan view, and a ratio of a diagonal line of an opening end portion of the recessed portion to a diagonal line of a base portion of each of the plurality of photo spacers is greater than 0 and lower than 0.8.

In addition, a method for manufacturing a display device according to the disclosure is a method for manufacturing a display device including a base substrate, a thin film transistor layer provided on the base substrate and in which a thin film transistor is arranged for each of a plurality of subpixels, and a plurality of photo spacers provided on the thin film transistor layer, the display device including a recessed portion having a caldera shape that is open upward formed at a top portion of each of the plurality of photo spacers, the method including forming the thin film transistor layer on the base substrate, and forming the plurality of photo spacers on the thin film transistor layer, in which the forming of the plurality of photo spacers includes applying a first photosensitive resin onto the thin film transistor layer, patterning the first photosensitive resin applied in the applying of the first photosensitive resin, applying a second photosensitive resin configured to form the plurality of photo spacers onto the first photosensitive resin patterned in the patterning, and forming the recessed portion having the caldera shape that is open upward at the top portion of each of the plurality of photo spacers by exposing the second photosensitive resin applied in the applying of the second photosensitive resin using a gray-tone mask or a halftone mask, and in the forming of the recessed portion, a ratio of a diameter or a diagonal line of an opening end portion of the recessed portion to a diameter or a diagonal line of a base portion of each of the plurality of photo spacers is adjusted to be greater than 0 and lower than 0.8.

Advantageous Effects of Disclosure

According to the disclosure, it is possible to curb transfer of a vapor deposition material transferred to a vapor deposition mask that is caused by contact with a photo spacer, and to improve the manufacturing yield of display devices.

DESCRIPTION OF EMBODIMENTS

Embodiments of the disclosure will be described below in detail with reference to the drawings. Further, the disclosure is not limited to the embodiments to be described below.

First Embodiment

Figure 1:
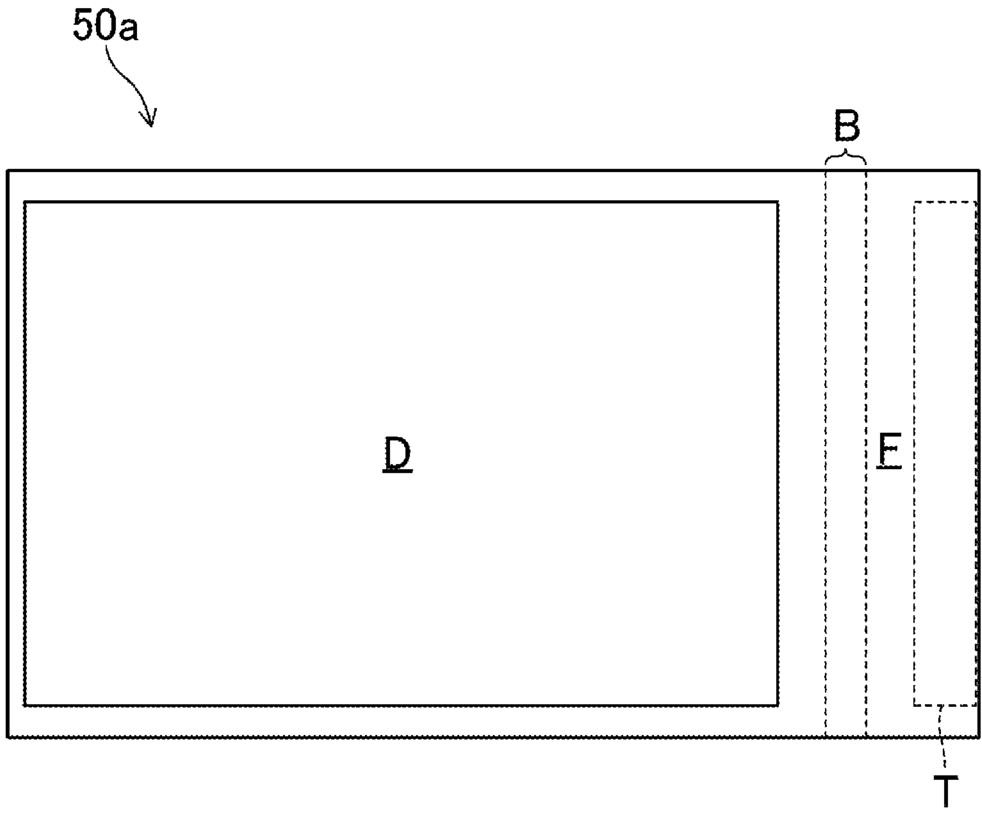
FIG. 1 is a plan view illustrating a schematic configuration of an organic EL display device according to a first embodiment of the disclosure.
Figure 2:
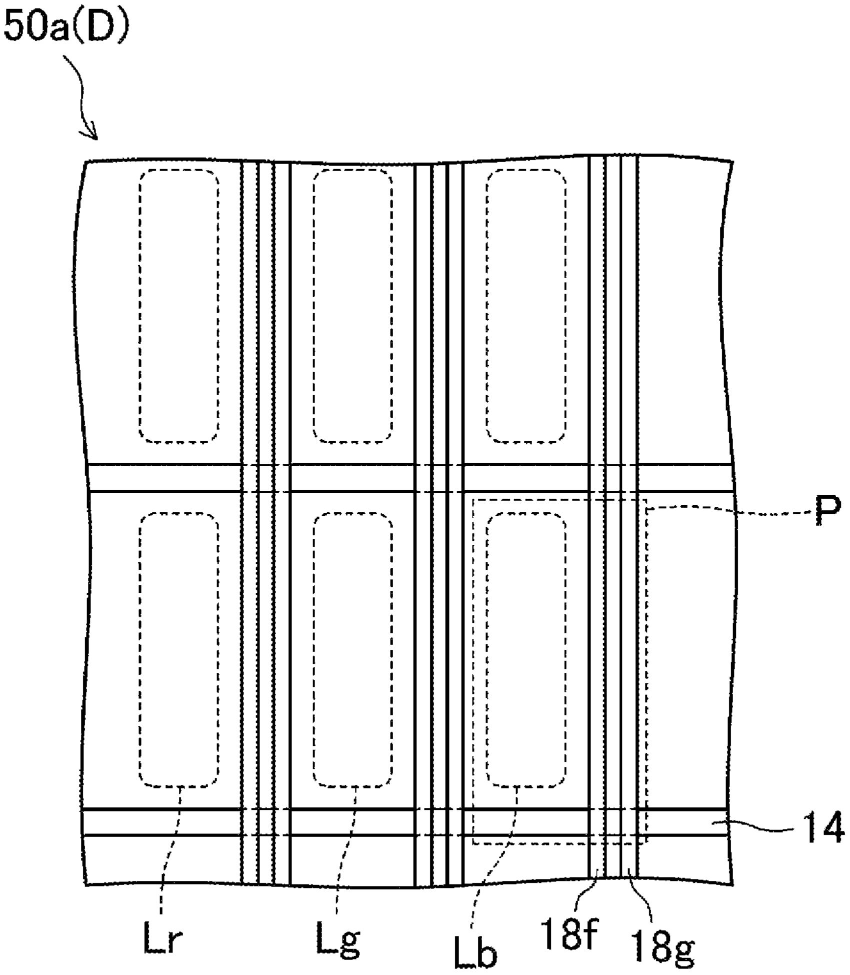
FIG. 2 is a plan view of a display region of the organic EL display device according to the first embodiment of the disclosure.
Figure 3:
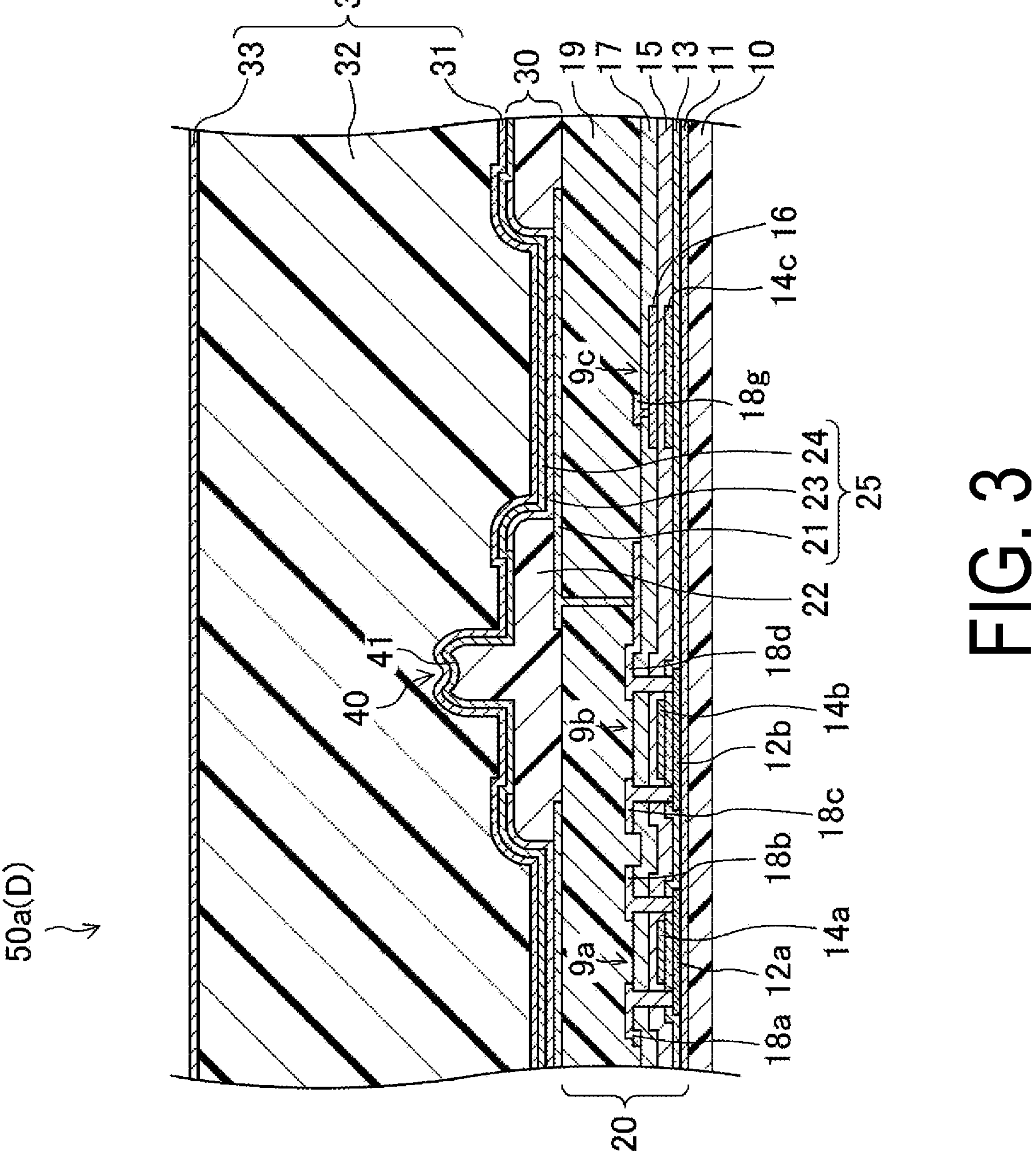
FIG. 3 is a cross-sectional view of the display region of the organic EL display device according to the first embodiment of the disclosure.
Figure 4:
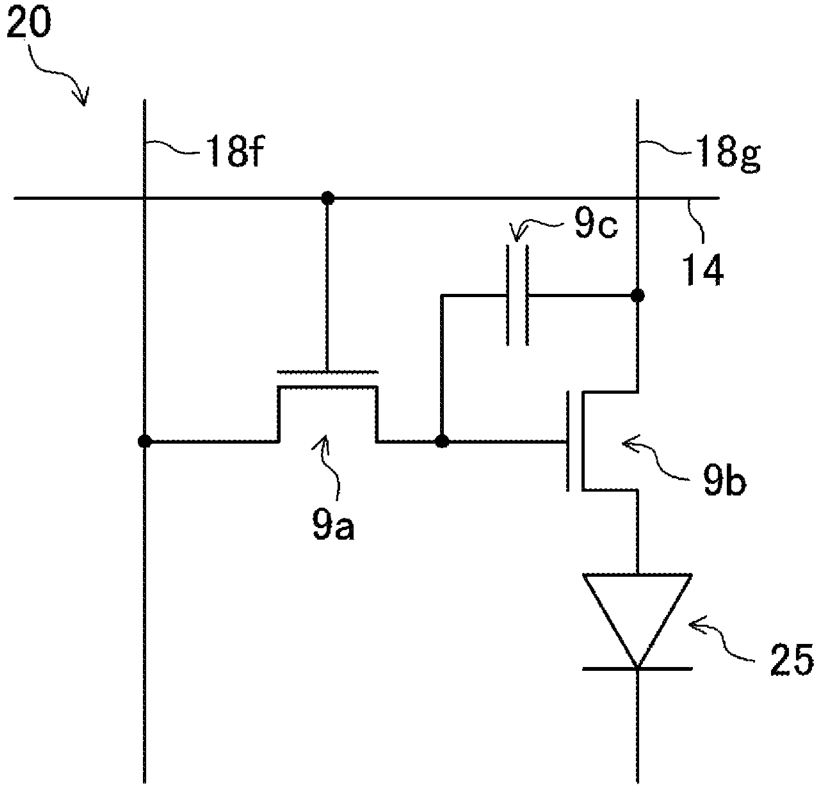
FIG. 4 is an equivalent circuit diagram of a TFT layer constituting the organic EL display device according to the first embodiment of the disclosure.
Figure 5:
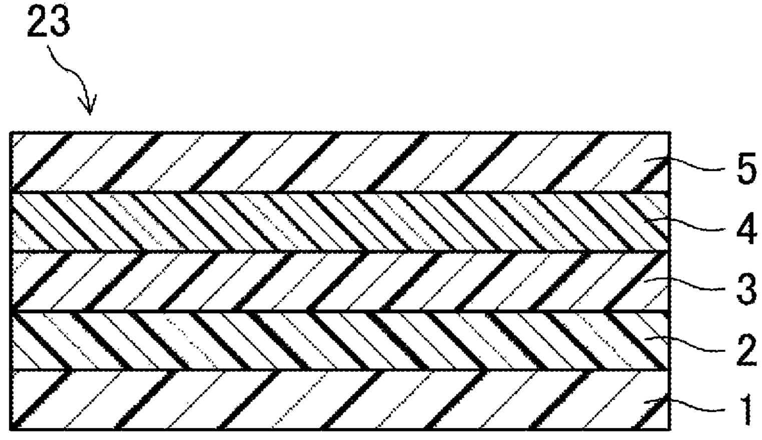
FIG. 5 is a cross-sectional view of an organic EL layer constituting the organic EL display device according to the first embodiment of the disclosure.
Figure 6:
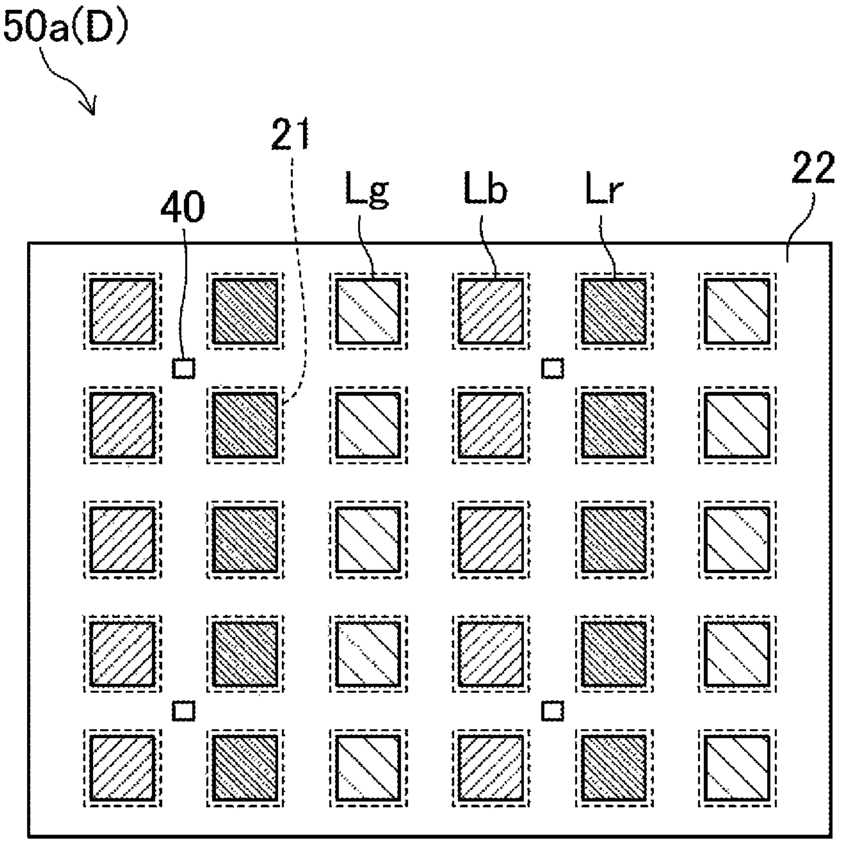
FIG. 6 is a plan view of arrangement of photo spacers in the display region of the organic EL display device according to the first embodiment of the disclosure.
Figure 7:
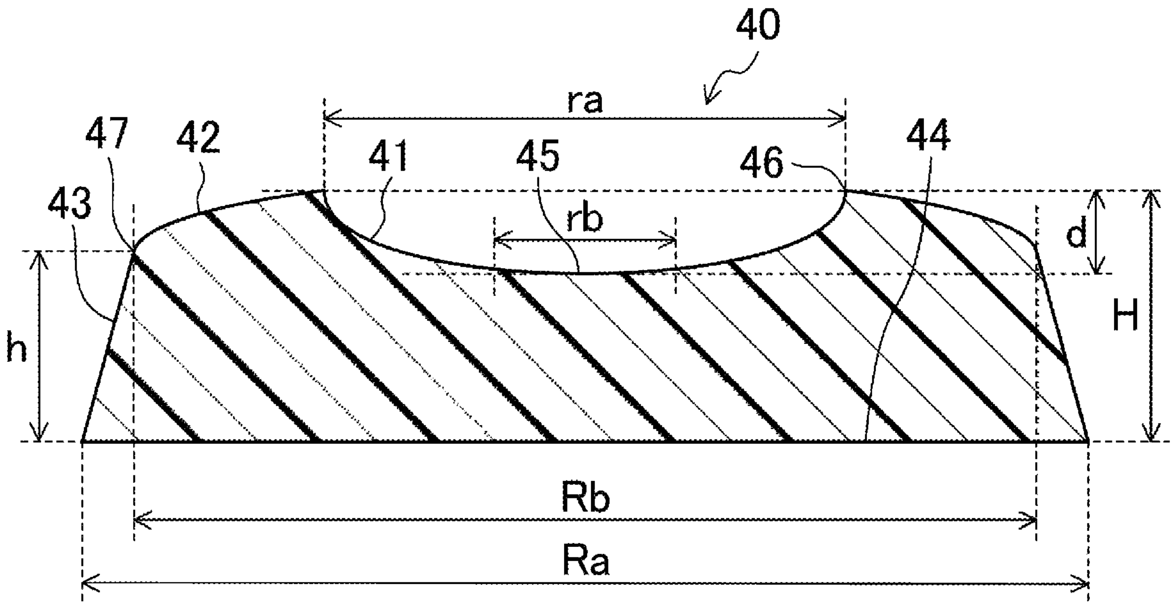
FIG. 7 is an enlarged cross-sectional view schematically illustrating a photo spacer arranged in the organic EL display device according to the first embodiment of the disclosure.
Figure 8:
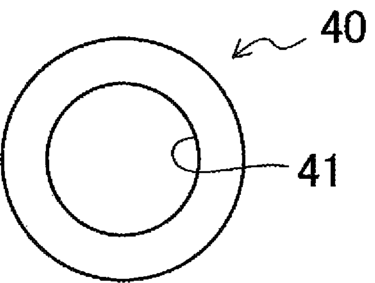
FIG. 8 is an enlarged plan view schematically illustrating a photo spacer arranged in the organic EL display device according to the first embodiment of the disclosure.
Figure 9:
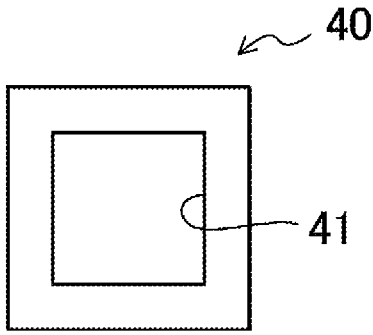
FIG. 9 is an enlarged plan view schematically illustrating a modified example of the photo spacer arranged in the organic EL display device according to the first embodiment of the disclosure, corresponding to FIG. 8.

FIG. 1 to FIG. 9 illustrate a first embodiment of a display device according to the disclosure. Further, in each of the following embodiments, an organic EL display device including organic EL elements will be exemplified as a display device including light-emitting elements. Here, FIG. 1 is a plan view illustrating a schematic configuration of an organic EL display device 50*a* according to the present embodiment. FIGS. 2 3 are a plan view and a cross-sectional view, respectively, of a display region D in the organic EL display device 50*a*. FIG. 4 is an equivalent circuit diagram of a TFT layer 20 constituting the organic EL display device 50*a*. FIG. 5 is a cross-sectional view of an organic EL layer 23 constituting the organic EL display device 50*a*. FIG. 6 is a plan view illustrating arrangement of photo spacers 40 in the display region D in the organic EL display device 50*a*. FIG. 7 is an enlarged cross-sectional view schematically illustrating the photo spacer 40 arranged in the organic EL display device 50*a*. FIG. 8 is an enlarged plan view schematically illustrating the photo spacer arranged in the organic EL display device 50*a*. FIG. 9 is an enlarged plan view schematically illustrating a modified example of the photo spacer 40 arranged in the organic EL display device 50*a*, corresponding to FIG. 8.

As illustrated in FIG. 1, the organic EL display device 50*a* includes, for example, a display region D that is provided in a rectangular shape and in which an image is displayed, and a frame region F provided in a frame-like shape around the display region D. Further, although the display region D having the rectangular shape is exemplified in the present embodiment, the rectangular shape has a substantially rectangular shape, for example, a shape having a side in an arc shape, a shape having a corner in an arc shape, and a shape having a notch in a part of a side.

As illustrated in FIG. 2, a plurality of subpixels P are arrayed in a matrix shape in the display region D. In addition, in the display region D, for example, a subpixel P including a red light-emitting region Lr for displaying red color, a subpixel P including a green light-emitting region Lg for displaying green color, and a subpixel P including a blue light-emitting region Lb for displaying blue color are provided adjacent to one another, as illustrated in FIG. 2. Further, one pixel is configured by, for example, three adjacent subpixels P including the red light-emitting region Lr, the green light-emitting region Lg, and the blue light-emitting region Lb in the display region D.

A terminal portion T is provided at the right end portion of the frame region F in FIG. 1. Furthermore, in the frame region F, a bending portion B that is bendable at 180° (in a U-shape) with the vertical direction in the drawing as a bending axis is provided between the display region D and the terminal portion T and extend in one direction (the vertical direction in the drawing) as illustrated in FIG. 1.

The organic EL display device 50*a* includes a resin substrate 10 provided as a base substrate, a TFT layer 20 provided on the resin substrate 10, an organic EL element layer 30 provided as a light-emitting element layer on the TFT layer 20 to constitute the display region D, and a sealing film 35 provided on the organic EL element layer 30 as illustrated in FIG. 3.

The resin substrate 10 is formed of, for example, a polyimide resin.

The TFT layer 20 includes a base coat film 11 provided on the resin substrate 10, a plurality of first TFTs 9*a*, a plurality of second TFTs 9*b* and a plurality of capacitors 9*c* which are provided on the base coat film 11, and a flattening film 19 provided as a second flattening film on each first TFT 9*a*, each second TFT 9*b*, and each capacitor 9*c* as illustrated in FIG. 3. Here, on the TFT layer 20, the base coat film 11, semiconductor layers 12*a* and 12*b*, a gate insulating film 13, a first wiring line layer such as gate lines 14 (see FIG. 2), gate electrodes 14*a* and 14*b*, and a lower conductive layer 14*c*, a second wiring line layer such as a first interlayer insulating film 15, and an upper conductive layer 16, a second interlayer insulating film 17, a third wiring line layer such as source lines 18*f* (see FIG. 2), source electrodes 18*a* and 18*c*, drain electrodes 18*b* and 18*d*, and power source lines 18*g*, and the flattening film 19 are layered on the resin substrate 10 in this order as illustrated in FIG. 3. In addition, as illustrated in FIGS. 2 4, a plurality of the gate lines 14 are provided on the TFT layer 20 and extend in parallel to one another in the horizontal direction in the drawings. In addition, as illustrated in FIGS. 2 4, a plurality of source lines 18*f* are provided on the TFT layer 20 and extend in parallel to each other in the vertical direction in the drawings. In addition, as illustrated in FIGS. 2 4, a plurality of power source lines 18*g* are provided on the TFT layer 20 and extend in parallel to each other in the vertical direction in the drawings. Further, the power source lines 18*g* are provided adjacent respectively to the source lines 18*f* as illustrated in FIG. 2. In addition, on the TFT layer 20, each of the subpixels P is provided with a first TFT 9*a*, a second TFT 9*b*, and a capacitor 9*c* as illustrated in FIG. 4.

Each of the base coat film 11, the gate insulating film 13, the first interlayer insulating film 15, and the second interlayer insulating film 17 is formed of, for example, a single-layer film or a layered film of an inorganic insulating film of silicon nitride (SiNx (x is a positive number)), silicon oxide ($SiO_2$), silicon oxynitride, or the like. The semiconductor layers 12*a* and 12*b* are formed of, for example, a low-temperature polysilicon film, an In—Ga—Zn—O-based oxide semiconductor film, or the like. Each of the first wiring line layer, the second wiring line layer, and the third wiring line layer is formed of, for example, a metal single layer film of a metal such as molybdenum (Mo), titanium (Ti), aluminum (Al), copper (Cu), or tungsten (W), or a metal layered film of a metal such as Mo (upper layer)/Al (intermediate layer)/Mo (lower layer), Ti/Al/Ti, Al (upper layer)/Ti (lower layer), Cu/Mo, or Cu/Ti.

The first TFT 9*a* and the second TFT 9*b* are p-type TFTs in which the semiconductor layers 12*a* and 12*b*, which will be described below, are doped with impurities, for example, boron.

The first TFT 9*a* is electrically connected to the corresponding gate line 14 and source line 18*f* in each of the subpixels P, as illustrated in FIG. 4. In addition, the first TFT 9*a* includes the semiconductor layer 12*a*, the gate insulating film 13, the gate electrode 14*a*, the first interlayer insulating film 15, the second interlayer insulating film 17, and the source electrode 18*a* and the drain electrode 18*b* provided in order on the base coat film 11 as illustrated in FIG. 3. Here, the semiconductor layer 12*a* is provided in an island shape on the base coat film 11 as illustrated in FIG. 3, and has, for example, a channel region, a source region, and a drain region. In addition, the gate insulating film 13 covers the semiconductor layer 12*a* as illustrated in FIG. 3. In addition, the gate electrode 14*a* is provided on the gate insulating film 13 to overlap the channel region of the semiconductor layer 12*a* as illustrated in FIG. 3. In addition, the first interlayer insulating film 15 and the second interlayer insulating film 17 cover the gate electrode 14*a* in order as illustrated in FIG. 3. In addition, the source electrode 18*a* and the drain electrode 18*b* are separated from each other on the second interlayer insulating film 17 as illustrated in FIG. 3. In addition, the source electrode 18*a* and the drain electrode 18*b* are electrically connected to the source region and the drain region of the semiconductor layer 12*a*, respectively, via contact holes formed in a layered film including the gate insulating film 13, the first interlayer insulating film 15, and the second interlayer insulating film 17 as illustrated in FIG. 3.

The second TFT 9*b* is electrically connected to the corresponding first TFT 9*a* and power source line 18*g* in each of the subpixels P as illustrated in FIG. 4. In addition, the second TFT 9*b* includes a semiconductor layer 12*b*, the gate insulating film 13, the gate electrode 14*b*, the first interlayer insulating film 15, the second interlayer insulating film 17, and the source electrode 18*c* and the drain electrode 18*d* provided in order on the base coat film 11 as illustrated in FIG. 3. Here, the semiconductor layer 12*b* is provided in an island shape on the base coat film 11 as illustrated in FIG. 3, and has, for example, a channel region, a source region, and a drain region. In addition, the gate insulating film 13 covers the semiconductor layer 12*b* as illustrated in FIG. 3. In addition, the gate electrode 14*b* is provided on the gate insulating film 13 to overlap the channel region of the semiconductor layer 12*b* as illustrated in FIG. 3. In addition, the first interlayer insulating film 15 and the second interlayer insulating film 17 cover the gate electrode 14*b* in order as illustrated in FIG. 3. In addition, the source electrode 18*c* and the drain electrode 18*d* are separated from each other on the second interlayer insulating film 17 as illustrated in FIG. 3. In addition, the source electrode 18*c* and the drain electrode 18*d* are electrically connected to the source region and the drain region of the semiconductor layer 12*b*, respectively, via contact holes formed in a layered film including the gate insulating film 13, the first interlayer insulating film 15, and the second interlayer insulating film 17 as illustrated in FIG. 3.

Further, although the top-gate type first TFT 9*a* and second TFT 9*b* are exemplified in the present embodiment, the first TFT 9*a* and the second TFT 9*b* may be bottom-gate type TFTs.

The capacitor 9*c* is electrically connected to the corresponding first TFT 9*a* and power source line 18*g* in each of the subpixels P as illustrated in FIG. 4. Here, the capacitor 9*c* includes the lower conductive layer 14*c*, the first interlayer insulating film 15 that covers the lower conductive layer 14*c*, and the upper conductive layer 16 provided on the first interlayer insulating film 15 to overlap the lower conductive layer 14*c* as illustrated in FIG. 3. Further, the upper conductive layer 16 is electrically connected to the power source line 18*g* via a contact hole formed in the second interlayer insulating film 17 as illustrated in FIG. 3.

The flattening film 19 has a flat surface in the display region D, and is made of, for example, an organic resin material such as a polyimide resin or an acrylic resin, or a polysiloxane-based spin on glass (SOG) material.

As illustrated in FIG. 3, the organic EL element layer 30 includes a plurality of organic EL elements 25 as a plurality of light-emitting elements arrayed in a matrix shape corresponding to the plurality of subpixels P.

As illustrated in FIG. 3, the organic EL element 25 includes a first electrode 21 provided on the flattening film 19 in each of the subpixels P, an organic EL layer 23 provided on the first electrode 21 in each of the subpixels P, and a second electrode 24 provided on the organic EL layer 23 common to the plurality of subpixels P.

As illustrated in FIG. 3, the first electrode 21 is electrically connected to the drain electrode 18*d* of the second TFT 9*b* of each of the subpixels P via a contact hole formed in the flattening film 19. In addition, the first electrode 21 has a function of injecting holes (positive holes) into the organic EL layer 23. In addition, the first electrode 21 is preferably formed of a material with a high work function to improve the efficiency in injection of holes into the organic EL layer 23. Here, examples of a material constituting the first electrode 21 include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of the material constituting the first electrode 21 may include alloys such as astatine (At)/astatine oxide ($AtO_2$). Furthermore, the material constituting the first electrode 21 may be an electrically conductive oxide such as tin oxide (SnO), zinc oxide (ZnO), indium tin oxide (ITO), or indium zinc oxide (IZO). In addition, the first electrode 21 may be formed by layering a plurality of layers formed of any of the materials described above. Further, examples of compound materials having a high work function include indium tin oxide (ITO) and indium zinc oxide (IZO).

Furthermore, a peripheral end portion of the first electrode 21 is covered with an edge cover 22 provided in a lattice shape common to the plurality of subpixels P as illustrated in FIGS. 3 and 6. Here, examples of a material constituting the edge cover 22 include positive photosensitive resin materials such as a polyimide resin, an acrylic resin, a polysiloxane resin, and a novolac resin, polysiloxane-based SOG materials, and the like.

The organic EL layer 23 is provided as a light-emitting function layer, and includes a hole injection layer 1, a hole transport layer 2, a light-emitting layer 3, an electron transport layer 4, and an electron injection layer 5 provided on the first electrode 21 in order as illustrated in FIG. 5.

The hole injection layer 1 is also called an anode buffer layer, and has a function of reducing an energy level difference between the first electrode 21 and the organic EL layer 23 to thereby improve the efficiency in injection of holes into the organic EL layer 23 from the first electrode 21. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function of improving the efficiency in hole transport from the first electrode 21 to the organic EL layer 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 21 and the second electrode 24, respectively, and the holes and the electrons recombine when a voltage is applied via the first electrode 21 and the second electrode 24. Here, the light-emitting layer 3 is formed of a material having high light-emitting efficiency. In addition, examples of the material constituting the light-emitting layer 3 include metal oxinoid compounds [8-hydroxyquinoline metal complexes], naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 has a function of efficiently transporting electrons to the light-emitting layer 3. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 has a function of reducing an energy level difference between the second electrode 24 and the organic EL layer 23 to thereby improve the efficiency in electron injection into the organic EL layer 23 from the second electrode 24, and this function lowers the drive voltage of the organic EL element 25. Further, the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

The second electrode 24 covers the organic EL layer 23 and the edge cover 22 of each of the subpixels P as illustrated in FIG. 3. In addition, the second electrode 24 has a function of injecting electrons into the organic EL layer 23. In addition, it is more preferable that the second electrode 24 be formed of a material having a low work function to improve the efficiency in electron injection into the organic EL layer 23. Here, examples of the material constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), and the like. In addition, the second electrode 24 may also be formed of an alloy of, for example, magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al), and the like. In addition, the second electrode 24 may be formed of a conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Further, examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

The sealing film 35 is provided on the organic EL element layer 30 to cover every organic EL element 25 as illustrated in FIG. 3. Here, the sealing film 35 includes a first inorganic sealing film 31 that covers the second electrode 24, an organic sealing film 32 provided on the first inorganic sealing film 31, and a second inorganic sealing film 33 that covers the organic sealing film 32 as illustrated in FIG. 3, and has a function of protecting the organic EL layer 23 from moisture, oxygen, and the like. Here, the first inorganic sealing film 31 and the second inorganic sealing film 33 are formed of an inorganic material, for example, silicon oxide ($SiO_2$), aluminum oxide ($Al_2O_3$), silicon nitride (SiNx (where x is a positive number)) such as trisilicon tetranitride ($Si_3N_4$), silicon carbonitride (SiCN), or the like. In addition, the organic sealing film 32 is formed of an organic material, for example, an acrylic resin, a polyurea resin, a parylene resin, a polyimide resin, a polyamide resin, or the like.

In the organic EL display device 50_a_, portion of the surface of the edge cover 22 protrudes upward in FIG. 3 to form a photo spacer 40 provided in an island shape as illustrated in FIGS. 3 and 6. That is, the photo spacer 40 is constituted by the portion of the edge cover 22 protruding from the upper face. Note that, although the photo spacer 40 may be formed of the same material as that of the edge cover 22 or may be formed of a different material from that of the edge cover 22, the photo spacer is preferably formed of the same material as that of the edge cover 22. Specifically, the photo spacer 40 is preferably formed of a positive photosensitive resin such as a photosensitive polyimide resin (having a density of about 1.4 $g/cm^3$) or a photosensitive acrylic resin (having a density of about 1.2 $g/cm^3$).

A plurality of photo spacers 40 are provided on the TFT layer 20 (specifically, the flattening film 19 constituting the upper face of the TFT layer 20) between a plurality of subpixels P arranged in the display region D as illustrated in FIGS. 3 and 6. Further, a plurality of photo spacers 40 are provided over the entire display panel including the frame region F.

Here, in the organic EL display device 50_a_, a caldera-shaped recessed portion 41 that is open upwards is formed at the top portion of the photo spacer 40 as illustrated in FIGS. 3 and 7. That is, the top portion of the photo spacer 40 is not convex but concave (caldera shape) in a cross-sectional view (when viewed in a cross-section with the center line as a cutting line) as illustrated in FIG. 7. Since the center part of the top portion of the photo spacer 40 (the inner part of the recessed portion 41, the caldera) is recessed as the recessed portion 41 as described above, the center part does not come into contact with the vapor deposition mask during vapor deposition. Since only the ridge (ridgeline) portion around the recessed portion 41 (caldera) (outer part of the recessed portion 41 or outer rim) comes into contact with the vapor deposition mask during vapor deposition, the contact area of the photo spacer with the vapor deposition mask is smaller than that of a photo spacer having a convex top portion in a cross-sectional view (a known photo spacer, hereinafter also simply referred to as a "photo spacer" without reference numeral). For this reason, the photo spacer 40 has a reduced amount of vapor deposition material transferred to the vapor deposition mask during vapor deposition. Further, the recessed portion 41 can be applied to all the photo spacers 40 provided on the organic EL display device 50_a_.

The photo spacer 40 and the recessed portion 41 thereof are formed in a circular shape in a plan view as illustrated in FIG. 8. In addition, in a plan view, a bottom face (caldera floor) 45 of the recessed portion 41 is formed in a circular shape having a diameter rb smaller than a diameter ra (caldera diameter, hereinafter also referred to as an "opening diameter ra of the recessed portion 41") at an opening end portion 46 of the recessed portion 41 as illustrated in FIG. 7. Further, the length from the opening end portion 46 to the bottom face 45 of the recessed portion 41 is referred to as a depth d of the recessed portion 41.

A first ridgeline portion 42 continuous from the opening end portion 46 of the recessed portion 41 and a second ridgeline portion 43 inclining more than the first ridgeline portion 42 and continuous to a base portion 44 of the photo spacer 40 are adjacent to each other around the photo spacer 40 (the outer rim) as illustrated in FIG. 7. A diameter Rb of a boundary portion 47 between the first ridgeline portion 42 and the second ridgeline portion 43 is smaller than a diameter Ra of the base portion 44 (hereinafter also referred to as an "outer diameter Ra of the photo spacer 40"). Further, the base portion 44 of the photo spacer 40 refers to an upper face portion of the edge cover 22 near the periphery of the photo spacer 40, which is a boundary surface between the photo spacer 40 and the edge cover 22 as illustrated in FIG. 3.

The first ridgeline portion 42 is a portion coming into contact with the vapor deposition mask during vapor deposition, corresponding to the top portion of the photo spacer 40. Therefore, a height H of the photo spacer 40 (hereinafter also referred to as a "height H at the top portion of the photo spacer 40") refers to a height from the base portion 44 of the photo spacer 40 to the opening end portion 46 of the recessed portion 41 (the inner circumferential portion of the first ridgeline portion 42) as illustrated in FIG. 7. On the other hand, the second ridgeline portion 43 is a portion corresponding to the side surface (outer circumferential surface) of the photo spacer 40 at the time of vapor deposition. For this reason, a height h from the base portion 44 of the photo spacer 40 to the boundary portion 47 between the first ridgeline portion 42 and the second ridgeline portion 43 (the outer circumferential portion of the first ridgeline portion 42 or the inner circumferential portion of the second ridgeline portion 43) as illustrated in FIG. 7 is the actual height (substantial height; hereinafter also referred to as an "effective height h of the photo spacer 40") of the photo spacer 40 at the time of vapor deposition (when the first ridgeline portion 42 turns into the top portion of the photo spacer 40), unlike the "height H at the top portion of the photo spacer 40".

In each of the subpixels P of the organic EL display device 50_a_ in the above-described configuration, a gate signal is input to the first TFT 9_a_ via the gate line 14 to turn on the first TFT 9_a_, a voltage corresponding to a source signal is written to the gate electrode 14_b_ and the capacitor 9_c_ of the second TFT 9_b_ via the source line 18_f_, a current from the power source line 18_g_ defined based on the gate voltage of the second TFT 9_b_ is supplied to the organic EL layer 23, and thereby the light-emitting layer 3 of the organic EL layer 23 emits light to display an image. Further, in the organic EL display device 50_a_, even when the first TFT 9_a_ is turned off, the gate voltage of the second TFT 9_b_ is held by the capacitor 9_c_, and thus, light emission by the light-emitting layer 3 is maintained until a gate signal of the next frame is input.

Next, a method for manufacturing the organic EL display device 50_a_ according to the present embodiment will be described. The method for manufacturing the organic EL display device 50_a_ includes a TFT layer forming step, an organic EL element layer forming step, and a sealing film forming step.

TFT Layer Forming Step

For example, the TFT layer 20 is formed on the surface of the resin substrate 10 formed on a glass substrate by forming the base coat film 11, the first TFTs 9_a_, the second TFTs 9_b_, the capacitors 9_c_, the flattening film 19, and the like by using a known method.

Organic EL Element Layer Forming Step

The organic EL element layer forming step includes a first electrode forming step, a photo spacer forming step, an automated optical inspection step, a light-emitting function layer forming step, and a second electrode forming step.

First Electrode Forming Step

First, the first electrodes 21 are formed on the flattening film 19 of the TFT layer 20 formed in the TFT layer forming step for each subpixel P by using, for example, a vacuum vapor deposition method using an FMM as a vapor deposition mask.

Photo Spacer Forming Step

The photo spacer forming step includes a first photosensitive resin applying step, a patterning step, a second photosensitive resin applying step, and a recessed portion forming step.

First Photosensitive Resin Applying Step

A first photosensitive resin is applied onto the flattening film 19 of the TFT layer 20 to cover the peripheral end portion of the first electrode. The first photosensitive resin is a resin material to form the edge cover 22.

Patterning Step

The edge cover 22 covering the peripheral end portion of the first electrode 21 is formed by patterning the applied first photosensitive resin.

Second Photosensitive Resin Applying Step

A second photosensitive resin is applied onto the patterned first photosensitive resin, i.e., the edge cover 22. The second photosensitive resin is a resin material to form the photo spacers 40. That is, a plurality of photo spacers 40 are formed of the second photosensitive resin. Specifically, a protruding portion that will form the plurality of photo spacers 40 is formed on the upper face of the edge cover 22.

Recessed Portion Forming Step

The portion protruding from the upper face of the edge cover 22 formed of the second photosensitive resin applied onto the edge cover 22, that is, the photo spacer 40, is exposed using a gray-tone mask or a halftone mask, thereby forming a caldera-shaped recessed portion 41 that is open upward at the top portion of the photo spacer 40. After the exposure, development and heat treatment are carried out. Through the above-described steps, the photo spacer 40 having the caldera-shaped recessed portion 41 at the top portion is formed.

Automated Optical Inspection Step

An automated optical inspection device is used to perform an AOI on the substrate (vapor deposited substrate after vapor deposition) on which the plurality of photo spacers 40 are formed in the series of photo spacer forming steps. In the AOI, the number of defects and the presence or absence of overflow in the number of defects are checked.

Light-Emitting Function Layer Forming Step

The organic EL layer 23 (the hole injection layer 1, the hole transport layer 2, the light-emitting layer 3, the electron transport layer 4, and the electron injection layer 5) is formed as a light-emitting function layer by using, for example, a vacuum vapor deposition method on the surface of the vapor deposited substrate surface that has passed the automated optical inspection step, specifically, on the first electrode 21 on which the edge cover 22 and the photo spacer 40 have been formed. Further, when the hole injection layer 1, the hole transport layer 2, the electron transport layer 4, and the electron injection layer 5 are formed, a CMM is used as a vapor deposition mask, and when the light-emitting layer 3 is formed, an FMM is used as a vapor deposition mask.

Second Electrode Forming Step

The second electrode 24 common to all the subpixels P is formed on the substrate surface on which the organic EL layer 23 has been formed, to cover the organic EL layer 23 and the edge cover 22 by using, for example, a vacuum vapor deposition method using a CMM as a vapor deposition mask.

As described above, the organic EL element layer 30 can be formed by forming the organic EL elements 25.

Sealing Film Forming Step

An inorganic insulating film such as a silicon nitride film, a silicon oxide film, or a silicon oxynitride film is formed by using a plasma CVD method using a CMM as a vapor deposition mask on the substrate surface on which the organic EL element layer 30 formed in the organic EL element layer forming step has been formed, to cover each of the organic EL elements 25, and thereby the first inorganic sealing film 31 is formed.

Subsequently, an organic resin material such as an acrylic resin is formed on the first inorganic sealing film 31 by using, for example, an ink-jet method, and thereby the organic sealing film 32 is formed.

Thereafter, an inorganic insulating film such as a silicon nitride film, a silicon oxide film, or a silicon oxynitride film is formed by using a plasma CVD method using a CMM as a vapor deposition mask to cover the organic sealing film 32 to form the second inorganic sealing film 33, and thereby the sealing film 35 is formed.

Finally, after a protective sheet (not illustrated) is attached to the substrate surface on which the sealing film 35 has been formed, the glass substrate side of the resin substrate 10 is irradiated with laser light, thereby peeling the glass substrate off from the bottom face of the resin substrate 10, and a protective sheet (not illustrated) is attached to the bottom face of the resin substrate 10 from which the glass substrate has been peeled off.

The organic EL display device **50*a*** of the present embodiment can be manufactured as described above.

Next, the shapes of the photo spacers 40 and the recessed portions 41 constituting the organic EL display device **50*a*** will be further described. As described above, the photo spacers serve as a support body for the vapor deposition masks. For this reason, the height of the photo spacers is one of important parameters, and has been determined in the related art in consideration of two contradictory viewpoints to be described in detail below.

Influence of Shadows

If the height of the photo spacers is increased, the distance (gap) between the vapor deposition mask and the vapor deposited substrate becomes longer, and thus the area of the vapor deposition material intruding onto the vapor deposited substrate from the openings of the vapor deposition mask increases. As a result, for example, when vapor deposition is performed using an FMM, the target film formation area may be widened due to intrusion of the vapor deposition material into adjacent pixels or the like, and thus a defect of a thinly spread film forming material (also called "worsening shadows (outer)") occurs. That is, from the viewpoint of the influence of shadows, it is preferable that the height of the photo spacers be low. On the other hand, when the height of the photo spacer is too low, the contact area of the top portion of the photo spacer with the vapor deposition mask increases, and thus the amount of the film forming material (transfer foreign matter, vapor deposition foreign matter) transferred to the vapor deposition mask side also increases. This situation causes overflow of the number of defects in the AOI of the vapor deposited substrate after vapor deposition as described above. In the above situation, although a height has been designed in consideration of balance between the shadow and the foreign matter transfer in known photo spacers, it is difficult to design a height sufficiently satisfying the above two viewpoints and there is a limit to design such a height.

Relationship Between Area of Top Portion of Photo Spacer and Transfer Amount of Foreign Matter Transferred In addition, the area of the top portion of a photo spacer in contact with a vapor deposition mask is also one of important parameters from the viewpoint of reducing the transfer amount of foreign matter transferred to the vapor deposition mask and curbing the stamp phenomenon. Here, there is a correlation between the area of the top portion of the photo spacer and the transfer amount of foreign matter. Thus, to reduce the transfer amount of foreign matter, it is considered effective to reduce the area of the top portion of the photo spacer 40, that is, the contact area with respect to the vapor deposition mask. Further, the transfer amount of foreign matter can be evaluated, for example, based on the number of defects (the transfer amount of foreign matter) in an AOI performed after vapor deposition.

Based on the above findings, the results obtained by evaluating the photo spacer 40 having the recessed portion 41 while changing the parameters of the height and the area of the top portion will be described in the following examples.

EXAMPLES

The disclosure will be described below based on examples. Further, the disclosure is not limited to the following examples, the following examples can be modified and changed based on the gist of the disclosure, and they are not intended to be excluded from the scope of the disclosure.

Example 1

According to the above-described method for manufacturing the organic EL display device 50*a*, an organic EL display device including a photo spacer 40 having a recessed portion 41 at the top portion and having "ra/Ra" and "h/H" shown in Table 1 as parameters of the height and the area of the top portion was manufactured. Further, "ra/Ra" refers to a ratio of an "opening diameter ra of the recessed portion 41" to an "outer diameter Ra of the photo spacer 40". "h/H" refers to a ratio of an "effective height h of the photo spacer 40" to a "height H at the top portion of the photo spacer 40".

Examples 2 to 3 and Comparative Example 2

Organic EL display devices were manufactured in the same manner as in Example 1 except that "ra/Ra" and "h/H" were changed to the values shown in Table 1.

Comparative Example 1

An organic EL display device was manufactured in the same manner as in Example 1 except that no recessed portion was formed in the photo spacer. Specifically, in the method for manufacturing the organic EL display device 50*a* described above, the recessed portion forming step was not performed.

Evaluation

In the process of manufacturing the organic EL display devices of each of Examples and Comparative Examples, the relative transfer amount of foreign matter, the presence or absence of overflow in the number of defects in an AOI, and the influence of shadows was evaluated based on the methods described below. The results are shown in Table 1.

Relative Transfer Amount of Foreign Matter

The transfer amounts of foreign matter (relative transfer amount of foreign matter transferred) in the process of manufacturing each organic EL display devices when the transfer amount of foreign matter in the process of manufacturing the organic EL display device of Comparative Example 1 was set to 100% were measured. Further, the transfer amount of foreign matter was calculated based on the number of defects in an AOI for the vapor deposited substrate after vapor deposition measured in the automated optical inspection step in the method for manufacturing the organic EL display device 50*a* described above.

Presence or Absence of Overflow of Number of Defects in AOI

An AOI for the vapor deposited substrate after vapor deposition was performed according to the automated optical inspection step in the method for manufacturing the organic EL display device 50*a* described above to check the presence or absence of overflow in the number of defects. Further, for the substrate experiencing overflow, a ratio (area ratio) of a non-inspected area portion to the entire substrate of 50% or more was regarded as "strong", and a ratio of less than 50% was regarded as "weak".

Influence of Shadows

Regarding the influence of shadows, after the light-emitting function layer forming step in the method for manufacturing the organic EL display device 50*a* described above, the vapor deposited substrate was observed with an optical microscope and evaluated based on the following evaluation criteria.

Evaluation Criteria

"Strong": Vapor deposition appeared on adjacent pixels as well (worsening shadows).

"Normal": Although no vapor deposition appeared on adjacent pixels, vapor deposition appeared on adjacent vapor deposition films.

"Weak": No vapor deposition appeared even on the adjacent vapor deposition film (improved or enhanced shadows).

TABLE 1

| No. | ra/Ra | h/H | Relative transfer amount of foreign matter | Overflow in number of defects in AOI | Influence of shadows |
|---|---|---|---|---|---|
| Comparative example 1 (No recessed portion) | 0 | 0.9 | 100% | Present (weak) | Strong |
| Example 1 | 0.25 | 0.8 | 70% | Absent | Normal |
| Example 2 | 0.5 | 0.6 | 42% | Absent | Weak |
| Example 3 | 0.75 | 0.4 | 41% | Absent | Weak |
| Comparative example 2 | 0.8 | 0 | 180% | Present (strong) | Weak |
| Example 4 | (of display region D) | (of display region D) | 50% | Absent | Weak |

TABLE 1-continued

| No. | ra/Ra | h/H | Relative transfer amount of foreign matter | Overflow in number of defects in AOI | Influence of shadows |
|---|---|---|---|---|---|
| | Center portion: 0.75 Peripheral portion: 0.25 | Center portion: 0.4 Peripheral portion: 0.8 | | | |

When the result of each example is compared with that of Comparative Example 1 in Table 1, as "ra/Ra" increased, the transfer amount of foreign matter decreased, and in each example, there was no overflow in the number of defects in the AOI. The reason for this is considered to be that, as the "opening diameter ra of the recessed portion 41" became greater with respect to the "outer diameter Ra of the photo spacer 40", the top portion of the photo spacer 40 coming into contact with the vapor deposition mask, specifically, the area of the first ridgeline portion 42 around the recessed portion 41 (the area of the top portion) became smaller. Further, as "ra/Ra" becomes greater, "h/H" becomes lower. The reason for this is considered to be that, as the opening diameter ra of the recessed portion 41" became greater, the height of the opening end portion 46, that is, the height of the "height H at the top portion of the photo spacer 40" itself became lower.

However, from Comparative Example 2, it was found that, when the "opening diameter ra of the recessed portion 41" became greater until "ra/Ra" became about 0.8, the transfer amount of foreign matter sharply increased. The reason for this is considered to be that, as a result of the fact that the area of the first ridgeline portion 42 is too small and the top portion of the photo spacer 40 in contact with the vapor deposition mask extends not only to the first ridgeline portion 42 but also to the second ridgeline portion 43, the area coming in contact with the vapor deposition mask increases.

In addition, it was found that the shadows were improved (enhanced) in each example as compared with Comparative Example 1. Specifically, it was found that as "ra/Ra" became greater (e.g., 0.4 or greater), the shadows were further improved.

In addition, the degree of contact of the vapor deposition mask and the top portion of the photo spacer 40 may be slightly different between the center portion of the vapor deposited substrate and the peripheral portion thereof due to a fine deflection of the vapor deposited substrate and/or the vapor deposition mask. In Example 4, it was found that the transfer amount of foreign matter is reduced, for example, even when "ra/Ra" decreases in the peripheral portion of the display region D of the vapor deposited substrate while "ra/Ra" increases in the center portion thereof. From this result, it has been suggested that the "opening diameters ra of the recessed portion 41" of the plurality of photo spacers 40 may not be the same over the entire vapor deposited substrate, and may be varied (changed) depending on positions on the vapor deposited substrate to adjust the heights and the areas of the top portions of the photo spacers 40 in consideration of the degree of contact.

From the above results, since each example includes the photo spacers 40 each formed with the recessed portion 41 having a predetermined "ra/Ra", remarkable effects of reducing the transfer amount of foreign matter were obtained even though "h/H" (effective height h of the photo spacers 40), which was expected to improve shadows, was low, when compared with Comparative Example 1 having the known photo spacers formed with no recessed portions. As described above, in each example, three kinds of effects including curbing of worsening shadows, a reduction in the transfer amount of foreign matter, and curbing of overflow in the number of defects in AOIs were simultaneously obtained.

Shape of Photo Spacer

Based on the results of the above-described examples, parameters (see FIG. 7) indicating the shapes (particularly, a height and an area of a top portion) of each photo spacer 40 and recessed portion 41 are described below. Further, as described above, all of the parameters may be the same or different in a plurality of photo spacers 40.

A ratio of the "opening diameter ra of the recessed part 41" to the "outer diameter Ra of the photo spacer 40" (a ratio of the diameter ra at the opening end portion 46 of the recessed portion 41 to the diameter Ra at the base portion 44 of the photo spacer 40) "ra/Ra" is greater than 0 and lower than 0.8 from the viewpoint of curbing worsening shadows. "ra/Ra" is preferably 0.2 or greater, and more preferably 0.4 or greater. In addition, the upper limit thereof is preferably 0.77 or lower, more preferably 0.75 or lower, from the viewpoint of curbing transfer of foreign matter to the vapor deposition mask.

An "outer diameter Ra of the photo spacer 40" (the diameter Ra at the base portion 44 of the photo spacer 40) is preferably 28 μm or greater and 60 μm or smaller from the viewpoint of curbing worsening shadows and transfer of foreign matter to the vapor deposition mask.

An "opening diameter ra of the recessed portion 41" (the diameter ra at the opening end portion 46 of the recessed portion 41) is preferably 15 μm or greater and 21 μm or smaller from the viewpoint of curbing worsening shadows and transfer of foreign matter to the vapor deposition mask.

A diameter rb of the bottom face 45 of the recessed portion 41 is preferably 10 μm or greater and 14 μm or smaller from the viewpoint of curbing worsening shadows and transfer of foreign matter to the vapor deposition mask.

A diameter Rb at the boundary portion 47 between first ridgeline portion 42 and the second ridgeline portion 43 in the photo spacer 40 is preferably 20 μm or greater and 43 μm or smaller from the viewpoint of curbing worsening shadows and transfer of foreign matter to the vapor deposition mask.

A ratio of the "effective height h of the photo spacer 40" to the "height H at the top portion of the photo spacer 40" (a ratio of the height from the base portion 44 of the photo spacer 40 to the boundary portion 47 with respect to the height H from the base portion 44 of the photo spacer 40 to the opening end portion 46 of the recessed portion 41) "h/H" is preferably more than 0, more preferably 0.2 or greater, and even more preferably 0.4 or greater from the viewpoint of curbing transfer of foreign matter to the vapor deposition mask. In addition, the upper limit of the ratio is preferably lower than 0.9, more preferably 0.85 or lower, and even more preferably 0.7 or lower, from the viewpoint of curbing worsening shadows and transfer of foreign matter to the vapor deposition mask.

A "height H at the top portion of the photo spacer 40" (a height H from the base portion 44 of the photo spacer 40 to the opening end portion 46 of the recessed portion 41) is preferably 1.5 μm or greater and 2 μm or less from the viewpoint of curbing worsening shadows and transfer of foreign matter to the vapor deposition mask.

A depth d of the recessed portion 41 (a depth from the opening end portion 46 to the bottom face 45 of the recessed portion 41) is preferably 0.2 μm or greater and 1 μm or less from the viewpoint of curbing worsening shadows and transfer of foreign matter to the vapor deposition mask.

Modified Example of First Embodiment

A planar shape of the photo spacer 40 and the recessed portion 41 is not limited to a circular shape, and may be an elliptical shape in a plan view or a rectangular shape as illustrated in FIG. 9. In this case, instead of the diameters of the photo spacer 40 and the recessed portion 41, the lengths of the diagonal lines of the photo spacer 40 and the recessed portion 41 can be used to define the parameters in the same manner. For example, a ratio "ra/Ra" of a diagonal line at the opening end portion 46 of the recessed portion 41 to a diagonal line at the base portion 44 of the photo spacer 40 may be greater than 0 and less than 0.8.

Effects

As described above, according to the organic EL display device 50*a* of the present embodiment and the modified example, the following effects can be obtained.

When the height of photo spacers is reduced in an organic EL display device including known photo spacers as described above, while worsening shadows is curbed, it is difficult to curb transfer of the vapor deposition material to the vapor deposition mask caused by the increase in the contact area of the top portion of the photo spacers with the vapor deposition mask. Even if the height is designed in consideration of balance between the shadows and transfer of foreign matter in the known photo spacers as described above, no organic EL display device which sufficiently satisfies the two effects of curbing both worsening shadows and transfer of foreign matter to the vapor deposition mask was obtained.

(1) With regard to this, even if the height of the photo spacer 40 (the height H at the top portion and the effective height h illustrated in FIG. 7) is reduced to curb worsening shadows in the organic EL display device 50*a*, the contact area of the top portion of the photo spacer 40 with the vapor deposition mask does not increase since the recessed portion 41 is formed at the top portion of the photo spacer 40. As a result, transfer of the vapor deposition material to the vapor deposition mask due to contact with the photo spacer 40 can be curbed. In other words, the transfer of the vapor deposition material to the vapor deposition mask can be curbed without increasing the height of the photo spacer 40 (without worsening the shadows). That is, even if the height is designed to be relatively low to reduce the influence of shadows in the photo spacer 40 having the recessed portion 41, the area of the top portion is small due to the recessed portion 41, and thus it is possible to obtain the organic EL display device 50*a* sufficiently satisfying the above-described two effects including curbing transfer of foreign matter to the vapor deposition mask.

(2) In the organic EL display device 50*a*, since the transfer amount of the vapor deposition material transferred to the vapor deposition mask is reduced, percentage at which overflow occurs in the number of defects in an AOI of the vapor deposited substrate after vapor deposition is reduced. As a result, the occurrence of non-inspected area portion of the vapor deposited substrate decreases, and thus the manufacturing yield can be improved.

(3) In the organic EL display device 50*a*, since the transfer amount of the vapor deposition material transferred to the vapor deposition mask is reduced, new effects such as prevention of degraded reliability due to moisture intrusion such as dark spots (dark dots, dark points, or black points) and inspections enabled under a higher sensitivity condition are also exhibited.

Other Embodiments

Although the organic EL layer having a five-layer structure including the hole injection layer, the hole transport layer, the light-emitting layer, the electron transport layer, and the electron injection layer has been exemplified in each of the embodiments described above, the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

Although the organic EL display device is exemplified as a display device in each of the embodiments described above, the disclosure is also applicable to a display device such as a liquid crystal display device employing an active matrix driving method.

In addition, in each of the embodiments described above, the organic EL display device is exemplified and described as a display device. The disclosure is also applicable to a display device including a plurality of light-emitting elements that are driven by an electrical current. For example, the disclosure is applicable to a display device including quantum-dot light emitting diodes (QLEDs) that are light-emitting elements using a quantum dot-containing layer.

INDUSTRIAL APPLICABILITY

As described above, the disclosure is useful for a flexible display device.

The invention claimed is:

1. A display device comprising:
a base substrate;
a thin film transistor layer provided on the base substrate and in which a thin film transistor is arranged for each of a plurality of subpixels; and
a plurality of photo spacers provided on the thin film transistor layer,
wherein a recessed portion having a caldera shape that is open upward is formed at a top portion of each of the plurality of photo spacers,
each of the plurality of photo spacers and the recessed portion are formed in a circular shape in a plan view, and
a ratio of a diameter of an opening end portion of the recessed portion to a diameter of a base portion of each of the plurality of photo spacers is greater than 0 and lower than 0.8.

2. The display device according to claim 1,
wherein the thin film transistor layer includes a flattening film in an upper face, and
the plurality of photo spacers are provided on the flattening film.

3. The display device according to claim 1, comprising:
a light-emitting element layer provided on the thin film transistor layer and in which a light-emitting element including a first electrode, a light-emitting function layer, and a second electrode that are layered in order for each of the plurality of subpixels is arranged; and
an edge cover configured to cover a peripheral end portion of the first electrode,
wherein the plurality of photo spacers are portions protruding from an upper face of the edge cover.

4. The display device according to claim 3,
wherein the plurality of photo spacers are formed of the same material as the edge cover.

5. The display device according to claim 3, comprising:
a sealing film configured to cover the light-emitting element.

6. The display device according to claim 3,
wherein the light-emitting element is an organic electroluminescence element.

7. The display device according to claim 1,
wherein the plurality of photo spacers are formed of a positive photosensitive resin.

8. The display device according to claim 1,
wherein a diameter of the base portion of each of the plurality of photo spacers is 28 μm or greater and 60 μm or smaller.

9. The display device according to claim 1,
wherein a diameter of the opening end portion of the recessed portion is 15 μm or greater and 21 μm or smaller.

10. The display device according to claim 1,
wherein a bottom face of each of the recessed portions is formed in a circular shape having a diameter smaller than the diameter of the opening end portion in a plan view, and
the diameter of the bottom face is 10 μm or greater and 14 μm or smaller.

11. The display device according to claim 1,
wherein a first ridgeline portion continuous from an opening end portion of the recessed portion and a second ridgeline portion inclined more than the first ridgeline portion and continuous to a base portion of each of the plurality of photo spacers are provided around each of the plurality of photo spacers, and
a diameter at a boundary portion between the first ridgeline portion and the second ridgeline portion is 20 μm or greater and 43 μm or smaller.

12. The display device according to claim 11,
wherein a ratio of a height from the base portion of each of the plurality of photo spacers to the boundary portion with respect to a height from the base portion to the opening end portion of the recessed portion is greater than 0 and lower than 0.9.

13. The display device according to claim 1,
wherein the height from the base portion of each of the plurality of photo spacers to the opening end portion of the recessed portion is 1.5 μm or greater and 2 μm or less.

14. The display device according to claim 1,
wherein a depth from the opening end portion of the recessed portion to a bottom face is 0.2 μm or greater and 1 μm or less.

15. A display device comprising:
a base substrate;
a thin film transistor layer provided on the base substrate and in which a thin film transistor is arranged for each of a plurality of subpixels; and
a plurality of photo spacers provided on the thin film transistor layer,
wherein a recessed portion having a caldera shape that is open upward is formed at a top portion of each of the plurality of photo spacers,
each of the plurality of photo spacers and the recessed portion are formed in a rectangular shape in a plan view, and
a ratio of a diagonal line of an opening end portion of the recessed portion to a diagonal line of a base portion of each of the plurality of photo spacers is greater than 0 and lower than 0.8.

16. The display device according to claim 15, comprising:
a light-emitting element layer provided on the thin film transistor layer and in which a light-emitting element including a first electrode, a light-emitting function layer, and a second electrode layered in order for each of the plurality of subpixels is arranged; and
an edge cover configured to cover a peripheral end portion of the first electrode,
wherein the plurality of photo spacers are portions protruding from an upper face of the edge cover.

17. A method for manufacturing a display device including
a base substrate,
a thin film transistor layer provided on the base substrate and in which a thin film transistor is arranged for each of a plurality of subpixels, and
a plurality of photo spacers provided on the thin film transistor layer,
the display device including a recessed portion having a caldera shape that is open upward formed at a top portion of each of the plurality of photo spacers,
the method comprising:
forming the thin film transistor layer on the base substrate; and
forming the plurality of photo spacers on the thin film transistor layer,
wherein the forming of the plurality of photo spacers includes
applying a first photosensitive resin on the thin film transistor layer,
patterning the first photosensitive resin applied in the applying of the first photosensitive resin, applying a second photosensitive resin configured to form the plurality of photo spacers on the first photosensitive resin patterned in the patterning, and forming the recessed portion having the caldera shape that is open upward at the top portion of each of the plurality of photo spacers by exposing the second photosensitive resin applied in the applying of the second photosensitive resin using a gray-tone mask or a halftone mask, and in the forming of the recessed portion, a ratio of a diameter or a diagonal line of an opening end portion of the recessed portion to a diameter or a diagonal line of a base portion of each of the plurality of photo spacers is adjusted to be greater than 0 and lower than 0.8.

18. The method for manufacturing a display device according to claim 17, comprising:

forming a first electrode for each of the plurality of subpixels on a flattening film after the flattening film is formed on the upper face in the forming of the thin film transistor layer and before the forming of the plurality of photo spacers, wherein, in the applying of the first photosensitive resin, the first photosensitive resin is applied to cover a peripheral end portion of the first electrode, in the patterning, an edge cover configured to cover the peripheral end portion of the first electrode is formed, and in the applying of the second photosensitive resin, the second photosensitive resin is applied onto the edge cover to form a protruding portion constituting the plurality of photo spacers on an upper face of the edge cover.

19. The method for manufacturing a display device according to claim 18, comprising:

automated optical inspecting for a vapor deposited substrate after vapor deposition after the forming of the plurality of photo spacers.

20. The method for manufacturing a display device according to claim 19, comprising:

after the automated optical inspecting, forming a light-emitting function layer on the first electrode; and forming a second electrode common to the plurality of subpixels to cover the light-emitting function layer and the edge cover.

* * * * *